United States Patent [19]

Feldmann et al.

[11] 4,391,657
[45] Jul. 5, 1983

[54] MANUFACTURE OF NIOBIUM-ALUMINUM SUPERCONDUCTING MATERIAL

[75] Inventors: William L. Feldmann, Bernardsville; John M. Rowell, Berkeley Heights; Paul H. Schmidt, Chatham, all of N.J.

[73] Assignee: Bell Telephone Laboratories, Incorporated, Murray Hill, N.J.

[21] Appl. No.: 284,523

[22] Filed: Jul. 17, 1981

[51] Int. Cl.$^3$ .......................................... H01L 39/24
[52] U.S. Cl. .................................. 148/133; 29/599; 420/901
[58] Field of Search .................. 148/11.5 F, 11.5 Q, 148/127, 133, 126; 29/599; 420/901; 75/235

[56] References Cited

U.S. PATENT DOCUMENTS

| | | | |
|---|---|---|---|
| 3,676,577 | 7/1972 | Martin et al. | 29/599 |
| 4,018,942 | 4/1977 | Müller et al. | 148/133 |
| 4,200,767 | 4/1980 | Nomura et al. | 29/599 |
| 4,223,434 | 9/1980 | Wang et al. | 148/11.5 F |

OTHER PUBLICATIONS

L. R. Testardi et al., "Superconductivity in Some Metastable Film Phases", *Journal of Applied Physics*, vol. 45, (1974), pp. 446–451.

R. L. Ciardella et al., "A Quench–Age Method for the Fabrication of Nb(Al) Superconductors", IEEE Transactions on Magnetics, vol. MAG-13, (1977), pp. 832–833.

K. Togano et al., "An Improved Method for Fabrication of $Nb_3(Al,Ge)$ Wire", IEEE Transactions on Magnetics, vol. MAG-13, (1977), pp. 478–479.

*Primary Examiner*—Peter K. Skiff
*Attorney, Agent, or Firm*—Peter A. Businger

[57] ABSTRACT

Niobium-aluminum superconducting wire and other shaped articles are made by heating a precursor body which comprises niobium, an auxiliary element which is more easily oxidizable than aluminum, and aluminum oxide, the aluminum oxide being supported by a surface or a matrix comprising niobium and the auxiliary element. Among suitable auxiliary elements are zirconium, hafnium, scandium, yttrium, and the nonmagnetic rare earths.

13 Claims, No Drawings

MANUFACTURE OF NIOBIUM-ALUMINUM SUPERCONDUCTING MATERIAL

TECHNICAL FIELD

The invention is concerned with the manufacture of superconducting materials.

BACKGROUND OF THE INVENTION

Superconducting materials are finding increasing use where strong, highly stable magnetic fields are required such as, e.g., in nuclear magnetic resonance spectroscopy, in high-resolution electron microscopy, and for deflecting and focusing high-energy particle beams. Also, as mentioned by T. Luhman et al., *Metallurgy of Superconducting Materials*, Academic Press, 1979, future applications of superconducting materials are likely in areas such as, e.g., the generation of power by magneto-hydrodynamic methods and by nuclear fusion, the separation of ores, the treatment of sewage, the purification of water, and the levitation of high-speed tracked vehicles. Considered most likely is the use of superconductors in electrical power generation facilities.

A great number of materials are known which become superconducting at temperatures below a certain critical temperature which is material-dependent and which is customarily denoted by $T_c$. Among materials having a desirably high critical temperature are certain niobium compounds such as, e.g., $Nb_3Al$, $Nb_3Ga$, $Nb_3Ge$, $Nb_3Sn$, and $Nb_3(Al_{0.8}Ge_{0.2})$; these compounds have critical temperatures in the vicinity of 17 degrees Kelvin and higher.

Since many high-$T_c$ superconducting compounds are brittle, special methods are needed for their manufacture into shaped articles and parts. For example, for the manufacture of niobium-aluminum and niobium-aluminum-germanium materials, high-temperature reaction methods have been proposed by R. L. Ciardella et al., "A Quench-Age Method for the Fabrication of Nb(Al) Superconductors", *IEEE Transactions on Magnetics*, Vol. MAG-13 (1977), pp. 832-833 and K. Togano et al., "An Improved Method for Fabrication of $Nb_3$ (Al,Ge) Wire", *IEEE Transactions on Magnetics*, Vol. MAG-13 (1977), pp. 478-479. Another method, known as "bronze process" and suitable, e.g., for the manufacture of $Nb_3Sn$ superconducting material is based on a solid state reaction at an interface between niobium and a copper-tin alloy. This reaction occurs, e.g., upon drawing niobium rods in a bronze matrix to wire dimensions and heating at a temperature in the range of 575-750 degrees Celsius.

While methods similar to the bronze process have been successfully applied to certain other niobium-based superconductor materials, no corresponding method has been available for the manufacture of suitably crystallized $Nb_3Al$ material. (Owing to a high critical field, $Nb_3Al$ is considered to be particularly suitable as a superconducting material.)

It has been hypothesized by L. R. Testardi et al., "Superconductivity in Some New Metastable Film Phases", *Journal of Applied Physics*, Vol. 45 (1974), pp. 446-451, that $Nb_3Al$ is a contaminant in thin films of $Nb_{0.67}Hf_{0.33}$ deposited on a hot sapphire substrate.

SUMMARY OF THE INVENTION

Superconducting wire and other shaped articles are made of a superconducting material which comprises niobium and aluminum and which may advantageously comprise at least one third element such as, e.g., germanium. In accordance with the invention, a precursor body is prepared comprising niobium, aluminum, oxide, and an auxiliary element which is more easily oxidizable than aluminum. For example, the auxiliary element may be zirconium, hafnium, scandium, yttrium, or a nonmagnetic rare earth element such as, e.g., cerium, praseodymium, or neodymium.

The auxiliary element and niobium may be alloyed or mixed, and the aluminum oxide material is supported on a surface or by a matrix comprising niobium and the auxiliary element. A step of heating leads to at least a partial oxidation of the auxiliary element and to formation of a desired superconducting composition at an interface between the niobium containing material and the aluminum oxide material.

DETAILED DESCRIPTION

A precursor body having a desired shape such as, e.g., foil, sheet, rod, wire, or fiber shape is prepared such that a material comprising niobium and at least one auxiliary element provide support for an aluminum oxide material. The auxiliary element has greater affinity to oxygen as compared with aluminum and may be selected, e.g., from among the elements zirconium, hafnium, scandium, yttrium, and the nonmagnetic rare earth elements. (Yttrium may be preferred as an auxiliary element due to a potentially beneficial effect of its presence on grain size of the desired superconducting beta-tungsten structure.)

Among elements whose presence is considered detrimental in the desired superconducting material are magnetic elements such as, e.g., Cr, Mn, Fe, Co, and Ni. Accordingly, their combined presence in the precursor body is preferably limited to less than 1 atomic percent. Similarly, the inclusion of hydrogen is preferably limited to less than 5 atomic percent.

The precursor body may be in the form, e.g., of a metallic body which is coated with aluminum oxide; alternatively, aluminum oxide may be dispersed in a matrix comprising niobium and the auxiliary element. For the manufacture of superconducting wire, the precursor body may be, e.g., a wire of niobium-zirconium which is coated with a layer of alumina powder or an alumina film. Alternatively, a tube of niobium-zirconium filled with alumina may be drawn into a precursor wire consisting of a niobium-zirconium jacket surrounding an alumina core.

Processing in accordance with the invention calls for heating the precursor body to reduce the aluminum oxide and to form an oxide of the auxiliary element. Preferred reduction temperatures are greater than or equal to 800 degrees Celsius and, in the interest of a desirable reaction rate, greater than or equal to 900 degrees Celsius. For the sake of controlling the reaction, reduction temperatures are preferably less than or equal to 1600 degrees C. As a result of such heating, niobium-aluminum superconducting material is produced, preferably forming a continuous path in a desired current direction. In the interest of adequate current carrying capacity the thickness of such a path is preferably greater than or equal to 1000 Angstroms; thickness being controlled by parameters such as processing time and temperature and also by the amount of auxiliary element present in the precursor body.

While the formation of a continuous path of superconducting niobium-aluminum material is preferred, a benefit may be realized in accordance with the invention even if gaps remain between portions of niobium-aluminum superconducting material. This is especially the case when the material of the initial supporting component itself is superconducting as, e.g., in the case of niobium-zirconium comprising zirconium in a preferred range of 20 to 40 atomic percent. In such a case the gaps between niobium-aluminum paths may be bridged by superconducting niobium-zirconium material.

An additional element such as, e.g., germanium may be included in the precursor body. This may be effected by alloying or mixing with niobium and the auxiliary element; alternatively, an additional oxide such as, e.g., germanium oxide may be admixed to the aluminum oxide. (Preferred amounts of germanium, relative to the combined amount of germanium and the auxiliary element, are in the range of 10 to 90 and preferably 20 to 40 atomic percent.) Upon heating in the presence of an element which reduces the additional oxide a desired compound such as, e.g., a niobium-aluminum-germanium compound may be formed. The presence of such additional element may be for the purpose of raising the critical temperature, thereby also raising the strength of the critical field.

Processing in accordance with the invention was successfully used for producing niobium-aluminum superconducting material at an interface between alumina and various niobium-containing materials. Among these are the niobium-yttrium, niobium-hafnium, niobium-zirconium, and niobium-hafnium-germanium starting materials shown in Table 1 together with measured temperatures $T_o$ and $T_c$. These temperatures correspond, respectively, to the onset and the midpoint of the transition to superconductivity of the processed material.

TABLE 1

| starting material | $T_o$ | $T_c$ |
|---|---|---|
| $Nb_{0.75} Y_{0.25}$ | 18.7 | 18.3 |
| $Nb_{0.67} Hf_{0.33}$ | 17.7 | 17.4 |
| $Nb_{0.80} Zr_{0.20}$ | 17.0 | 16.8 |
| $Nb_{0.75} Hf_{0.19} Ge_{0.06}$ | 18.7 | 18.3 |

The following examples illustrate preferred embodiments in accordance with the invention.

EXAMPLE 1

A 0.999 pure mixture of 72.7 atomic percent Nb, 18.2 atomic percent Zr, and 9.1 atomic percent $Al_2O_3$ was hot pressed at a temperature of 1550 degrees Celsius in an argon atmosphere into a cylinder having a diameter of 6.3 millimeters and a length of 50.8 millimeters. The critical temperature of the pressed cylinder was 14 degrees Kelvin.

EXAMPLE 2

A 10-mil wire of $Nb_{0.75}Zr_{0.25}$ having a length of 4 inches was roughened with 400 grit alumina abrasive and ultrasonically cleaned first in cloroform, then in acetone, and finally in ethanol. Alumina powder obtained from the Air Products Company under the designation Linde-B (0.5 micrometer approximate particle size) was applied to the surface of the air-dried, vertically mounted wire. The coated wire was heated for 75 minutes at a temperature of 1100 degrees Celsius. Heating was by passing through the wire a current produced by a direct-current arc welding source, and temperature was measured by means of a pyrometer. The critical temperature of the processed wire was 13 degrees Kelvin.

What is claimed is:

1. Method for making a $Nb_3Al$ superconducting shaped article which is superconducting at a temperature which is greater than or equal to 10 degrees Kelvin, said method comprising heating a precursor body consisting essentially of a supporting component and a supported component, said supporting component comprising a first element which is niobium and at least one additional element whose chemical affinity for oxygen is greater than the chemical affinity between aluminum an oxygen, said supported component comprising aluminum oxide, and heating being at a temperature in the range of from 800 to 1600 degrees Celsius and for a time which is sufficient to reduce the aluminum oxide and to form an oxide of at least a portion of said at least one additional element, whereby at least a layer consisting essentially of superconducting niobium-aluminum is formed.

2. Method of claim 1 in which a substantial portion of said superconducting niobium-aluminum has beta-tungsten structure.

3. Method of claim 1 in which, in said supporting component, niobium and said at least one additional element are mixed.

4. Method of claim 1 in which, in said supporting component, niobium and said at least one additional element are alloyed.

5. Method of claim 1 in which said supported component is essentially a layer on said supporting component.

6. Method of claim 1 in which said supported component is dispersed in a matrix consisting essentially of said supporting component.

7. Method of claim 1 in which said supporting component comprises at least one third element.

8. Method of claim 7 in which said at least one third element is germanium.

9. Method of claim 1 in which said supported component comprises at least one additional oxide.

10. Method of claim 9 in which said at least one additional oxide is germanium oxide.

11. Method of claim 1 in which said superconducting layer has a thickness which is greater than or equal to 1000 Angstroms.

12. Method of claim 1 in which said precursor body comprises less than 1 atomic percent magnetic elements.

13. Method of claim 1 in which said precursor body comprises less than 5 atomic percent hydrogen.

* * * * *